United States Patent
Kim et al.

(10) Patent No.: US 7,348,728 B2
(45) Date of Patent: Mar. 25, 2008

(54) PLASMA DISPLAY APPARATUS

(75) Inventors: Ki-Jung Kim, Suwon-si (KR); Kyoung-Ho Kang, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 276 days.

(21) Appl. No.: 11/274,348

(22) Filed: Nov. 16, 2005

(65) Prior Publication Data

US 2006/0103595 A1    May 18, 2006

(30) Foreign Application Priority Data

Nov. 17, 2004    (KR) .................. 10-2004-0094202

(51) Int. Cl.
*H01J 17/49*    (2006.01)
(52) U.S. Cl. ...................... 313/583; 313/582
(58) Field of Classification Search ......... 313/581–587
See application file for complete search history.

(56) References Cited

U.S. PATENT DOCUMENTS 5,686,790 A * 11/1997 Curtin et al. ............... 313/493

FOREIGN PATENT DOCUMENTS

JP    6324281 A1    2/1988

* cited by examiner

*Primary Examiner*—Vip Patel
(74) *Attorney, Agent, or Firm*—H.C. Park & Associates, PLC

(57) ABSTRACT

A plasma display apparatus including a plasma display panel, on which terminal units of electrodes are drawn and disposed at an edge of the panel, a chassis base supporting the plasma display panel, and a circuit board arranged at a rear portion of the chassis base to drive the plasma display panel. A connection member has a first end arranged at the plasma display panel and a second end arranged at the circuit board, and the first end includes a wiring unit on which conductive lines are formed to correspond in a one-to-one basis with the electrode terminal units and to overlap the electrode terminal units. At least one conductive bump is arranged between each electrode terminal unit and conductive line to couple the terminal unit with the conductive line.

13 Claims, 3 Drawing Sheets

PLASMA DISPLAY APPARATUS

CROSS-REFERENCE TO RELATED APPLICATIONS

This application claims priority to and the benefit of Korean Patent Application No. 10-2004-0094202, filed on Nov. 17, 2004, which is hereby incorporated by reference for all purposes as if fully set forth herein.

BACKGROUND OF THE INVENTION

1. Field of the Invention

The present invention relates to a plasma display apparatus, and more particularly, to a plasma display apparatus having an improved connecting structure between electrode terminal units and connection members.

2. Discussion of the Background

Generally, a plasma display apparatus is a flat panel display that displays images using gas discharge, and it is considered a next generation display that may replace the cathode ray tube (CRT) since it has excellent display characteristics such as display capacity, brightness, contrast, and viewing angle.

The plasma display apparatus includes a plasma display panel, a chassis base supporting the plasma display panel, a circuit board mounted on a rear portion of the chassis base to drive the plasma display panel, and a case housing the plasma display panel, the chassis base, and the circuit board.

In the plasma display panel, a glow discharge is generated by applying a predetermined voltage to electrodes that are arranged in a sealed, gas-filled space. The glow discharge generates ultraviolet rays, which excite a phosphor layer formed in a predetermined pattern, thereby displaying an image.

Each electrode in the plasma display panel includes a terminal unit, to which voltages are applied, and the terminal units are arranged at at least an edge of the plasma display panel. Additionally, the terminal units are coupled with connection members, such as a flexible printed cable (FPC), which is coupled with the circuit board.

In more detail, a connection member includes a wiring unit, and the wiring unit includes a conductive line overlapping each terminal unit. The conductive lines of the wiring units and the terminal units may be connected by an anisotropic conductive film, on which conductive balls formed by plating gold (Au) on nickel (Ni) particles are evenly distributed. That is, the anisotropic conductive film is arranged between the conductive lines and the terminal units, and is heated and pressed by a heating and pressing tool to connect it between the terminal units and the conductive lines.

However, since the anisotropic conductive film is heated and pressed, the conductive balls formed on the film may be lumped together instead of being evenly distributed. If lumped conductive balls are located between adjacent terminal units, an electric short may occur between the terminal units.

SUMMARY OF THE INVENTION

The present invention provides a plasma display apparatus having an improved connection structure between electrode terminal units and connection members, thereby preventing an electric short from occurring and reducing a number of manufacturing processes.

Additional features of the invention will be set forth in the description which follows, and in part will be apparent from the description, or may be learned by practice of the invention.

The present invention discloses a plasma display apparatus including a plasma display panel comprising electrode terminal units arranged at an edge of the panel, a chassis base coupled with and supporting the plasma display panel, a circuit board arranged at a rear portion of the chassis base to drive the plasma display panel, and a connection member including a first end arranged at the edge of plasma display panel and a second end arranged at the circuit board. The first end includes a wiring unit on which conductive lines are formed to correspond in a one-to-one basis with the electrode terminal units and to overlap the terminal units, and at least one conductive bump is arranged between each electrode terminal unit and conductive line to couple the terminal unit with the conductive line.

The present invention also discloses a plasma display apparatus including a plasma display panel, a connecting member, and at least one conductive bump. The plasma display panel includes a front substrate, sustain electrodes including terminal units drawn to at least an edge of the front substrate, a rear substrate facing the front substrate, address electrodes crossing the sustain electrodes and having terminal units drawn to at least an edge of the rear substrate, barrier ribs arranged between the front substrate and the rear substrate to define discharge cells, and a phosphor layer arranged in the discharge cells. The connection member has a first end arranged at the plasma display panel and a second end arranged at a circuit board for driving the plasma display panel. The first end includes a wiring unit on which conductive lines are formed to correspond in a one-to-one basis with electrode terminal units and to overlap the electrode terminal units. The conductive bump is arranged between each electrode terminal unit and conductive line to couple the electrode terminal unit with the conductive line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
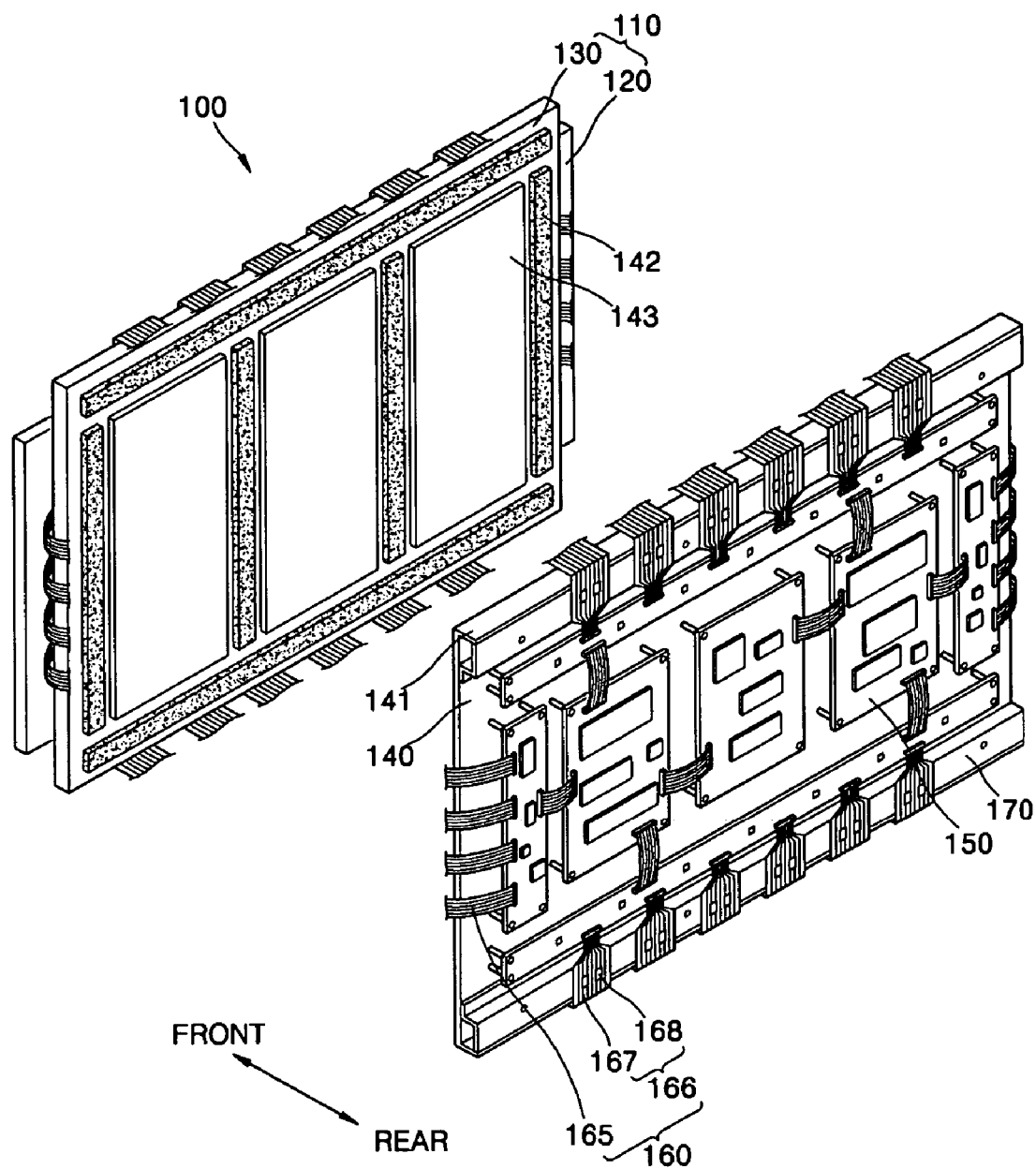
FIG. 1 is an exploded perspective view showing a plasma display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

FIG. 1 is an exploded perspective view showing a plasma display apparatus according to an exemplary embodiment of the present invention.

Referring to FIG. 1, the plasma display apparatus 100 a plasma display panel 110 and a chassis base 140.

The chassis base 140 is arranged behind, and substantially parallel with, the plasma display panel 110. The chassis base 140, which may be formed of aluminum, supports the plasma display panel 110 and receives and dissipates heat generated by the plasma display panel 110. A bent portion 141 may be formed at an edge of the chassis base 140 to prevent the chassis base 140 from bending.

The chassis base 140 is coupled with the plasma display panel 110 by an adhesive member 142 such as double-sided tape. Further, a thermal dissipation member 143 is arranged between the chassis base 140 and the plasma display panel 110 to assist with dissipating heat generated by the plasma display panel 110 to outside the apparatus.

Additionally, a circuit board 150 is installed on the rear portion of the chassis base 140 to drive the plasma display panel 110. Therefore, various electronic elements are mounted on the circuit board 150. The plasma display panel 110 and the chassis base 140 are housed in a case (not shown) to constitute the plasma display apparatus 100.

The circuit board 150 is electrically coupled with the plasma display panel 110 by a connection member 160. The connection member 160 may be a flexible printed cable (FPC) or a tape carrier package (TCP), which is formed by mounting at least one device on a FPC.

According to the present embodiment, the connection members 160 arranged at the left and right sides of the chassis base 140 include FPCs 165, and the connection members 160 arranged at the top and bottom of the chassis base 140 include TCPs 166.

The TCPs 166 are separated from each other. One end of the TCPs 166 may be coupled with address electrodes (132, refer to FIG. 2) arranged on the plasma display panel 110 after passing around the upper and lower edges of the chassis base 140, and the other ends may be coupled with a driving unit of the circuit board 150 for driving the address electrodes 132. Additionally, the TCPs 166 include at least one device 168, such as an address driving integrated circuit (IC), mounted on each flexible printed cable 167, and the devices 168 are arranged adjacent to the upper and lower edges of the chassis base 140.

The devices 168 are supported by reinforcing members 170. Thus, the reinforcing members 170 are arranged between the chassis base 140 and the TCPs 166 so that the TCPs 166 are laid across a surface of the reinforcing members 170, and the devices 168 correspond to the reinforcing members 170. The reinforcing members 170 may be formed of a metal, and they are coupled with the rear surface of the chassis base 140 to prevent the chassis base 140 from bending and to increase the chassis base's heat dissipating area, thereby increasing heat dissipation efficiency.

Various types of plasma display panels may be used as the plasma display panel 110. For example, as shown in FIG. 2, an alternating current (AC) plasma display panel having a three-electrode surface discharge structure may be used.

Figure 2:
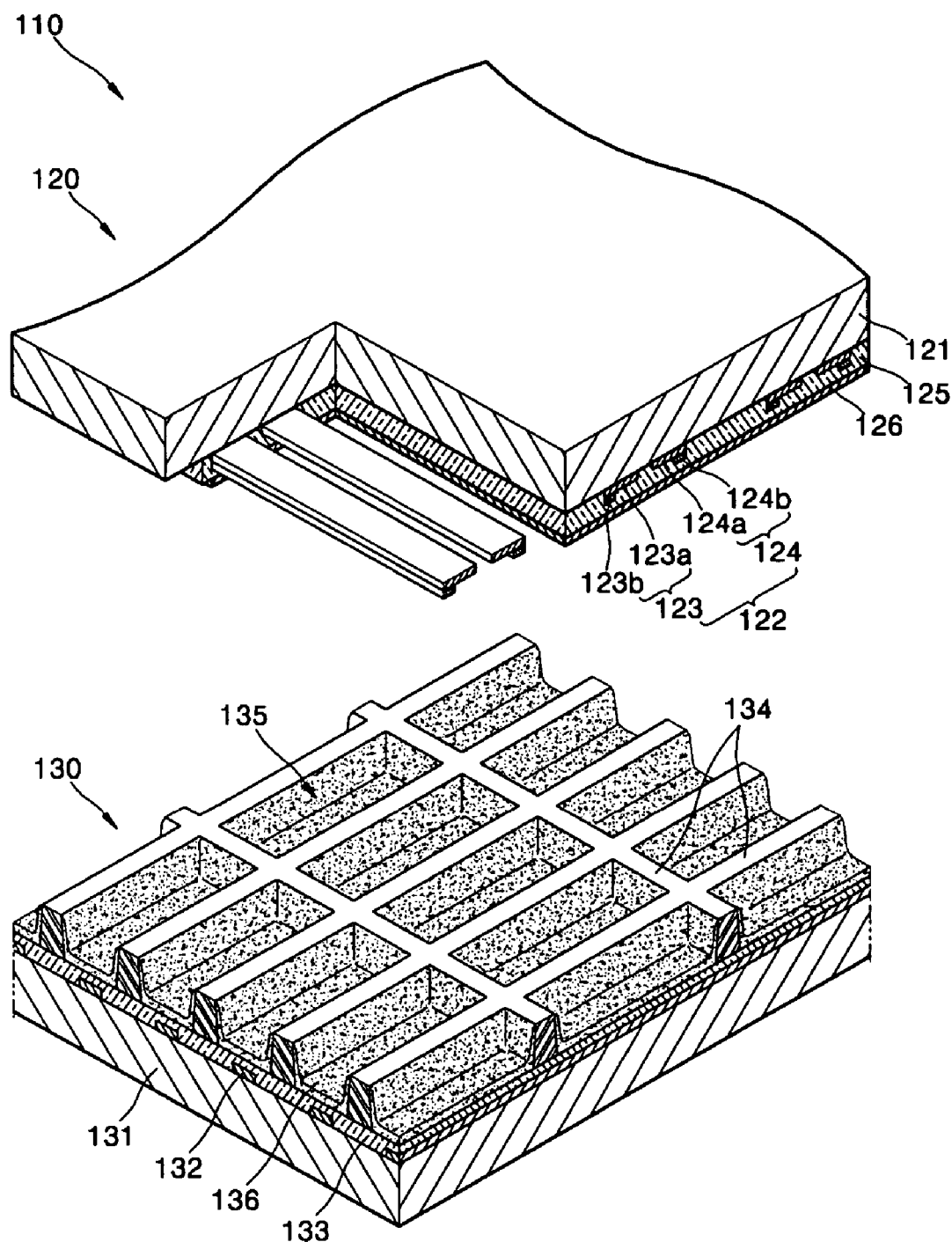
FIG. 2 is a partial perspective view showing a part of a plasma display panel of FIG. 1.

Referring to FIG. 2, the plasma display panel 110 includes a front panel 120 coupled with a rear panel 130.

The front panel 120 includes a front substrate 121, sustain electrode pairs 122 formed on a rear surface of the front substrate 121 and including X electrodes 123 and Y electrodes 124, a front dielectric layer 125 covering the sustain electrode pairs 122, and a protective layer 126 covering the front dielectric layer 125. The X electrode 123 and the Y electrode 124 perform as a common electrode and a scan electrode, respectively, and they are separated from each other by a discharge gap. In addition, the X electrode 123 includes a transparent electrode 123a and a bus electrode 123b coupled with the transparent electrode 123a, and the Y electrode 124 includes a transparent electrode 124a and a bus electrode 124b coupled with the transparent electrode 124a.

The rear panel 130 includes a rear substrate 131, address electrodes 132 arranged on the rear substrate 131 and extending in a direction crossing the sustain electrode pairs 122, a rear dielectric layer covering the address electrodes 132, barrier ribs 134 formed on the rear dielectric layer 133 to define discharge cells 135, and a phosphor layer 136 arranged in the discharge cells 135. Therefore, regions where the sustain electrode pairs 122 and the address electrodes 132 cross each other correspond to the discharge cells 135, and a discharge gas is filled in the discharge cells 135.

Ends of the X electrodes 123 and the Y electrodes 124 are drawn to at least an edge of the front substrate 121, and ends of the address electrodes 132 are drawn to at least an edge of the rear substrate 131. The ends of the electrodes 123, 124, and 132 form terminal units, and the connection members 160 are arranged at, and coupled with, the terminal units, thereby enabling the circuit board 150 to apply voltages to the electrodes 123, 124, and 132.

Figure 3:
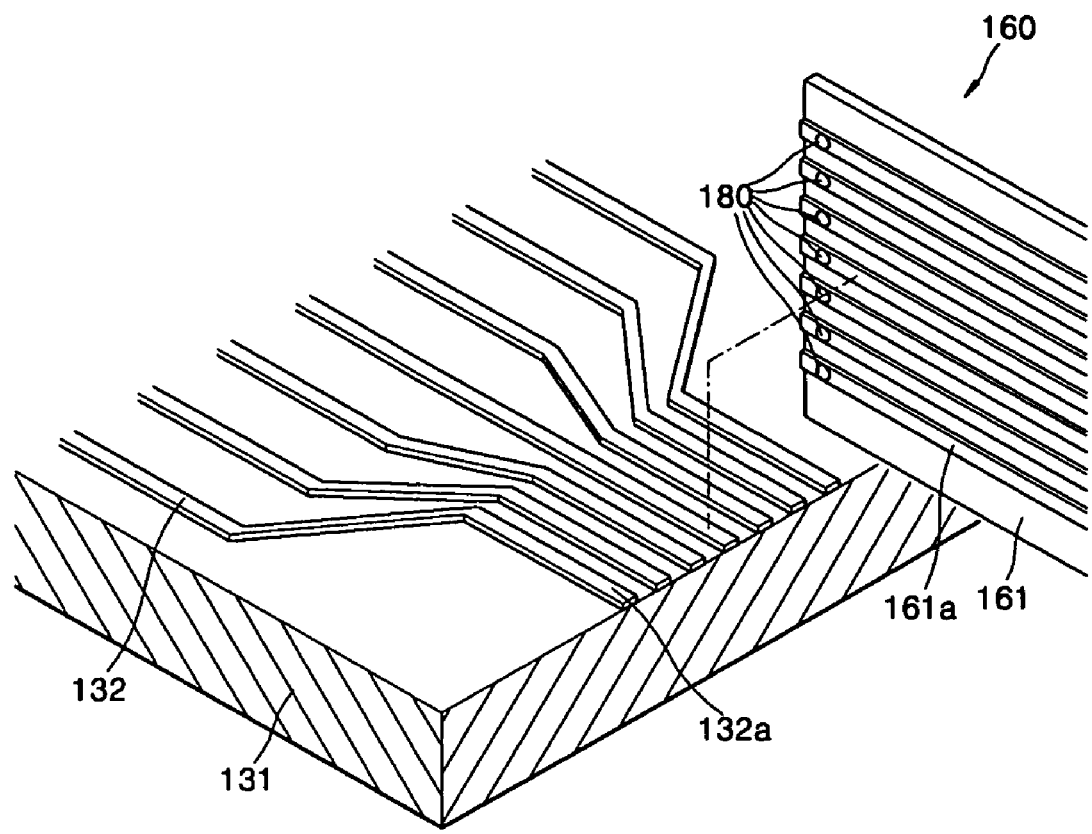
FIG. 3 is an exploded perspective view showing a connection member and terminal units of electrodes of FIG. 1.

FIG. 3 shows a connection member before it is coupled with terminal units drawn to the edge of the substrate. Here, the substrate may be a front substrate or a rear substrate, and the terminal units may be the terminals units of the X electrodes, Y electrodes, or the address electrodes. An example, in which terminal units of the address electrodes are drawn to an edge of the rear substrate, is described below.

Referring to FIG. 3, terminal units 132a of the address electrodes 132 are drawn to the edge of the rear substrate 131 and arranged with predetermined intervals therebetween. The connection members 160 are arranged to correspond to the terminal units 132a.

Wiring unit 161, on which the conductive lines 161a are formed, is arranged on the connection member 160, and the conductive lines 161a of the wiring unit 161 are formed to have the same pitches as those between terminal units 132a so that the conductive lines 161a correspond to the terminal units 132a on a one-to-one basis and overlap the terminal units 132a.

Figure 4:
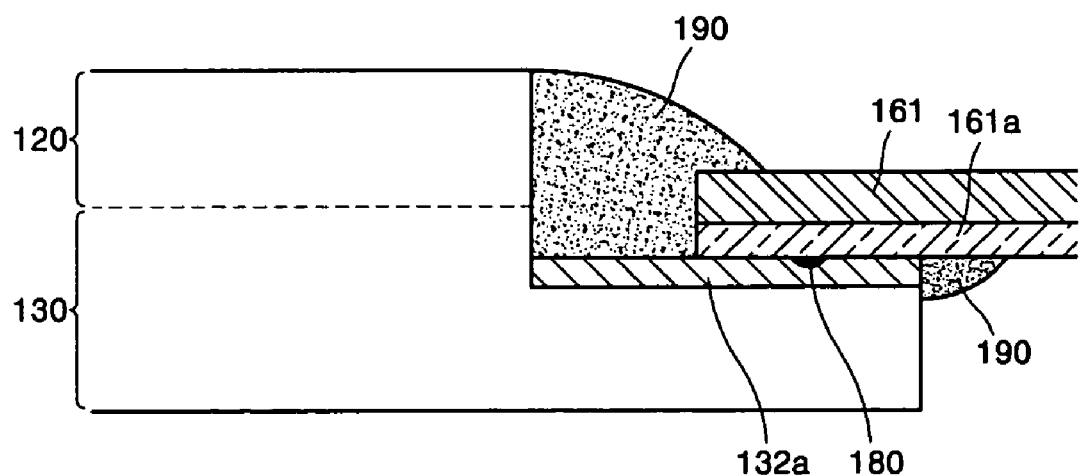
FIG. 4 is a cross-sectional view showing the connection member and a terminal unit of FIG. 3 coupled together.

Additionally, at least one conductive bump 180 is included with each conductive line 161a at a portion of the conductive line 161a that overlaps the terminal unit 132a. The conductive bump 180 may be formed of a highly conductive material such as gold (Au), and the conductive bump 180 may protrude from the conductive line 161a in a substantially hemispherical shape. When the conductive lines 161a and the terminal units 132a are heated and pressed by a heating and pressing tool while they are overlapped with each other, the conductive bumps 180 may be easily pressed into the terminal units 132a as shown in FIG. 4. It is desirable that the conductive bumps 180 be sized so they do not contact adjacent terminal units 132a or conductive lines 161a after being pressed. Since the conductive bumps are arranged between the conductive lines 161a and the terminal units 132a, they may be alternatively formed on the terminal units 132a.

Since the conductive bumps 180 infiltrate the terminal units 132a, the conductive lines 161a and the terminal units 132a are coupled with each other. Accordingly, a conventional anisotropic conductive film, on which conductive balls formed by plating Au on nickel (Ni) particles are distributed, need not be used. Accordingly, the short that may occur between terminal units caused by the anisotropic conductive film may be prevented. Additionally, the process of attaching the anisotropic conductive film may be omitted, thereby reducing processing time.

The peripheral areas of the connection member 160, where it overlaps with the terminal units 132a, may be covered by a protective member 190, as shown in FIG. 4. The protective member 190 may prevent impurities such as humidity from infiltrating into the overlapped portions between the terminal units 132a and the conductive lines 161a. The protective member 190 may be formed of an ultraviolet (UV)-curable resin such as a silicon resin or an epoxy acrylate based resin. It is desirable that the protective member 190 extend so as to completely cover the exposed portions of the terminal units 132a.

According to exemplary embodiments of the present invention, the conductive lines of the connection member and the electrode terminal units are connected using conductive bumps, thereby preventing the short that may occur between the terminal units and the conductive lines caused by a conventional anisotropic conductive film. Furthermore, since the process of attaching the anisotropic conductive film may be omitted, processing time may be reduced.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A plasma display apparatus, comprising:
   a plasma display panel comprising electrode terminal units arranged at an edge of the plasma display panel;
   a chassis base coupled with and supporting the plasma display panel;
   a circuit board arranged at a rear portion of the chassis base to drive the plasma display panel;
   a connection member comprising a first end arranged at the edge of the plasma display panel and a second end arranged at the circuit board, the first end comprising a wiring unit on which conductive lines are formed to correspond in a one-to-one basis with the electrode terminal units and to overlap the electrode terminal units; and
   at least one conductive bump arranged between each electrode terminal unit and conductive line to couple the electrode terminal unit with the conductive line.

2. The plasma display apparatus of claim 1, wherein the conductive bump comprises gold.

3. The plasma display apparatus of claim 1, wherein the connection member is either a flexible printed cable or a tape carrier package, the tape carrier package comprising at least a device on the flexible printed cable.

4. The plasma display apparatus of claim 1, further comprising a protective member,
   wherein the protective member covers a peripheral area of the connection member that overlaps with the electrode terminal units.

5. The plasma display apparatus of claim 4, wherein the protective member comprises a resin.

6. The plasma display apparatus of claim 5, wherein the resin is one resin selected from the group consisting of a silicon resin and an ultraviolet ray-curable resin.

7. The plasma display apparatus of claim 1, wherein the conductive bump is formed on the conductive lines and protrudes from the conductive lines in a substantially hemispherical shape.

8. The plasma display apparatus of claim 1, wherein the conductive bump is formed on the electrode terminal units and protrudes from the electrode terminal units in a substantially hemispherical shape.

9. A plasma display apparatus, comprising:
   a plasma display panel comprising a front substrate, sustain electrodes including terminal units drawn to at least an edge of the front substrate, a rear substrate facing the front substrate, address electrodes crossing the sustain electrodes and including terminal units drawn to at least an edge of the rear substrate, barrier ribs arranged between the front substrate and the rear substrate to define discharge cells, and a phosphor layer arranged in the discharge cells;
   a connection member comprising a first end arranged at the plasma display panel and a second end arranged at a circuit board for driving the plasma display panel, the first end comprising a wiring unit on which conductive lines are formed to correspond in a one-to-one basis with electrode terminal units and to overlap the electrode terminal units; and
   at least one conductive bump arranged between each electrode terminal unit and conductive line to couple the electrode terminal unit with the conductive line.

10. The plasma display apparatus of claim 9, wherein the sustain electrodes and the address electrodes are covered by a front dielectric layer and a rear dielectric layer, respectively.

11. The plasma display apparatus of claim 10, wherein a pair of the sustain electrodes are arranged at each discharge cell, and a first sustain electrode performs as a common electrode and a second sustain electrode performs as a scan electrode.

12. The plasma display apparatus of claim 9, wherein the first end of the connection member is arranged at the edge of the front substrate, and the conductive lines correspond in a one-to-one basis with the sustain electrode terminal units and overlap the sustain electrode terminal units.

13. The plasma display apparatus of claim 9, wherein the first end of the connection member is arranged at the edge of the rear substrate, and the conductive lines correspond in a one-to-one basis with the address electrode terminal units and overlap the address electrode terminal units.

* * * * *